United States Patent [19]

Yiannoulos

[11] 4,087,900

[45] May 9, 1978

[54] FABRICATION OF SEMICONDUCTOR INTEGRATED CIRCUIT STRUCTURE INCLUDING INJECTION LOGIC CONFIGURATION COMPATIBLE WITH COMPLEMENTARY BIPOLAR TRANSISTORS UTILIZING SIMULTANEOUS FORMATION OF DEVICE REGIONS

[75] Inventor: Aristides Antony Yiannoulos, Reading, Pa.

[73] Assignee: Bell Telephone Laboratories, Incorporated, Murray Hill, N.J.

[21] Appl. No.: 733,057

[22] Filed: Oct. 18, 1976

[51] Int. Cl.² .................... H01L 21/22; H01L 21/20
[52] U.S. Cl. ......................................... 29/578; 29/589; 148/1.5; 148/175; 148/187; 148/190; 148/191; 357/44; 357/46; 357/48; 357/89; 357/90; 357/91
[58] Field of Search ............... 148/175, 187, 190, 191, 148/1.5; 29/577, 578, 589; 357/44, 46, 48, 89, 90, 92

[56] References Cited

U.S. PATENT DOCUMENTS

| | | | |
|---|---|---|---|
| 3,617,827 | 11/1971 | Schmitz et al. | 148/191 X |
| 3,643,235 | 2/1972 | Berger et al. | 357/92 X |
| 3,667,006 | 5/1972 | Ruegg | 148/175 X |
| 3,702,428 | 11/1972 | Schmitz et al. | 357/44 |
| 3,823,353 | 7/1974 | Berger et al. | 357/92 X |
| 3,909,807 | 9/1975 | Fulton | 357/92 X |
| 3,922,565 | 11/1975 | Berger et al. | 357/44 X |
| 3,930,909 | 1/1976 | Schmitz et al. | 148/175 |
| 3,955,269 | 5/1976 | Magdo et al. | 29/577 |
| 4,032,962 | 6/1977 | Balyoz et al. | 357/48 X |

OTHER PUBLICATIONS

Platt, A., "High Integrated Base Doping Transistor" I.B.M. Tech. Discl. Bull., vol. 13, No. 3, Aug. 1970, pp. 815–816.

Berger et al., "Monolithically Integrated Logical Basic Circuit" Ibid., vol. 16, No. 2, Jul. 1973, pp. 650–651.

Primary Examiner—L. Dewayne Rutledge
Assistant Examiner—W.G. Saba
Attorney, Agent, or Firm—H. W. Lockhart

[57] ABSTRACT

A version of integrated injection logic is disclosed in which both the switching transistor and the current source transistor are of the vertical type and in which the logic gates are fabricated in the same semiconductor integrated chip with linear circuits which are based on the complementary bipolar integrated circuit technology.

The injection logic gate is fabricated simultaneously with the linear integrated circuit using selected steps of the complementary bipolar technology. High voltage linear circuits and efficient logic circuits are achieved based on the use of a single moderate resistivity N-type epitaxial layer deposited on a high resistivity P-type substrate. In the logic circuit portion the epitaxial layer forms the collector zone of the current source transistor and the base zone of the switching transistor.

9 Claims, 15 Drawing Figures

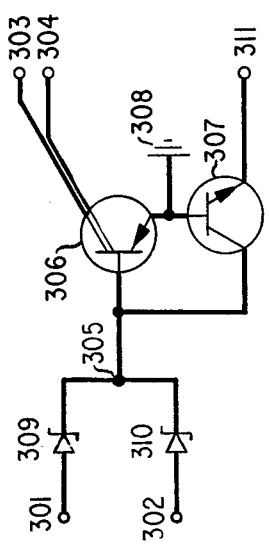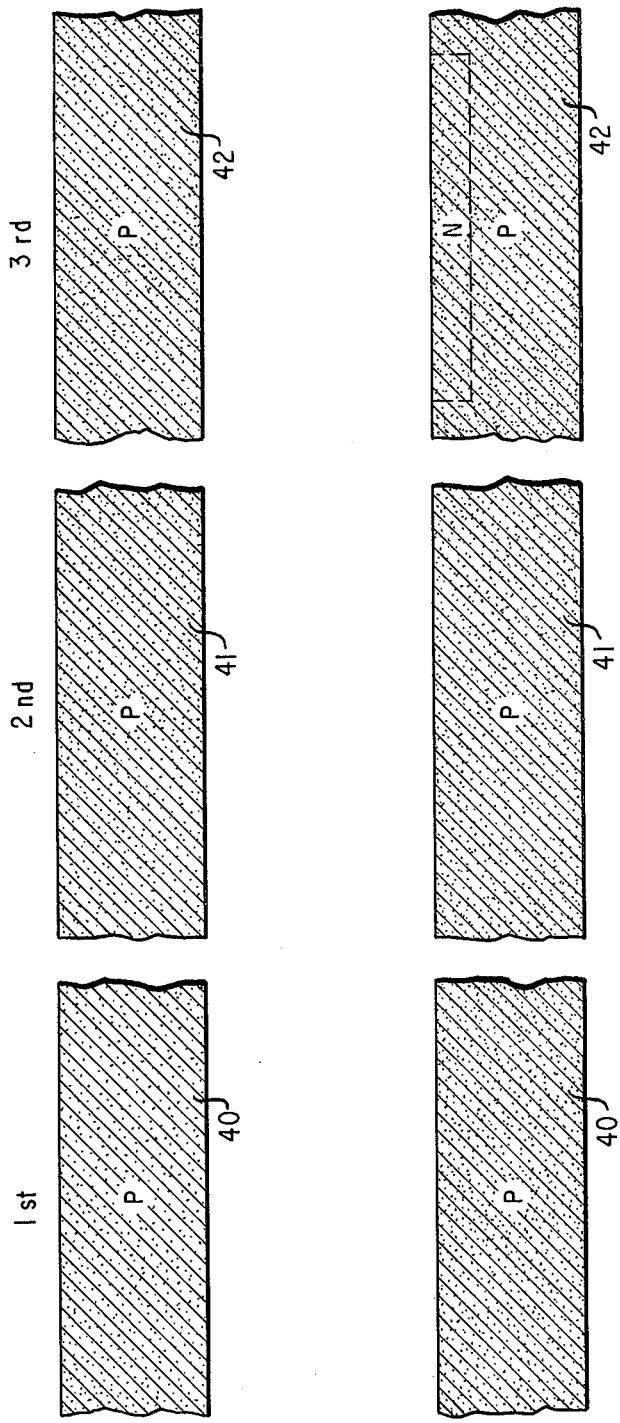
FIG. 3
FIG. 4
FIG. 5

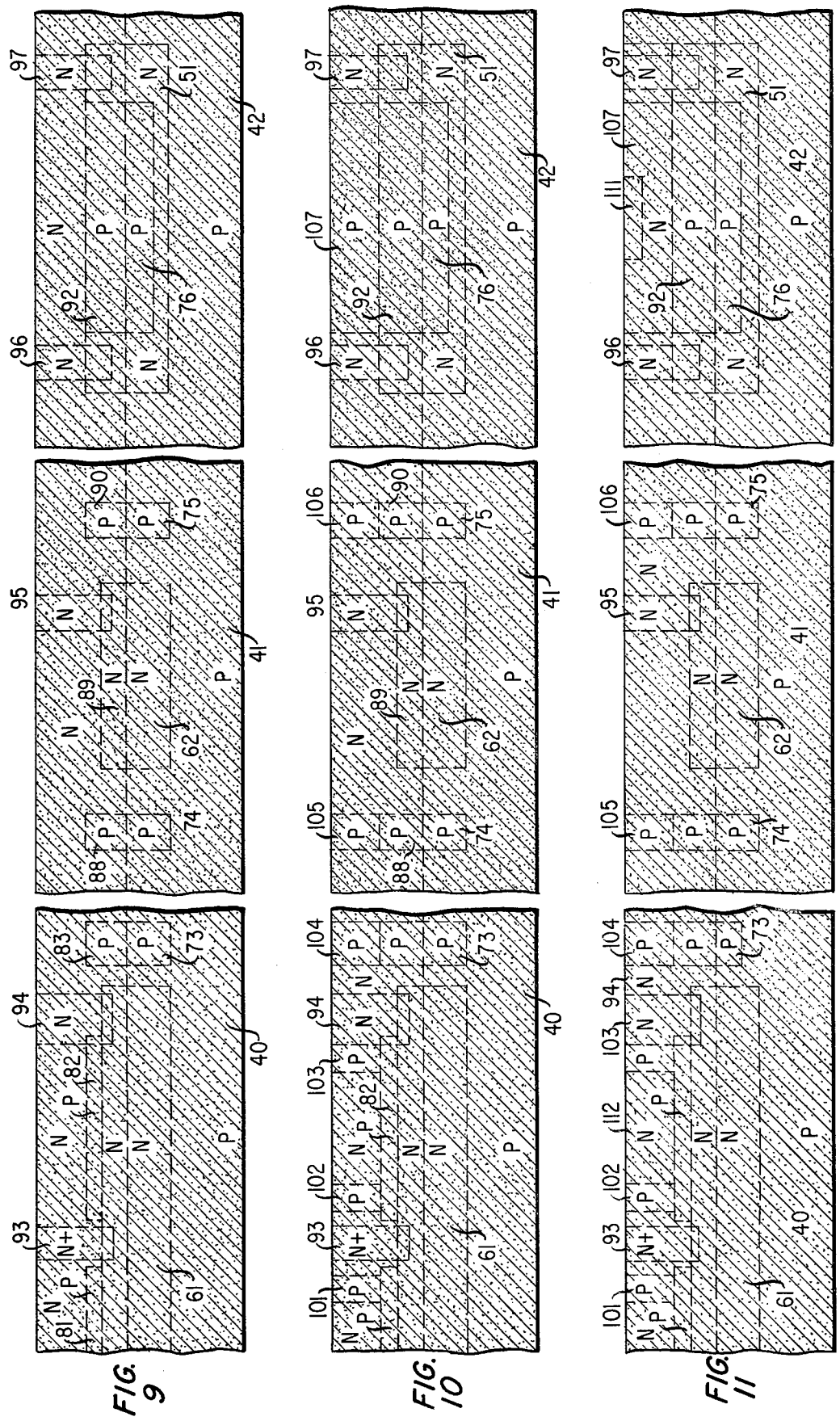

FABRICATION OF SEMICONDUCTOR INTEGRATED CIRCUIT STRUCTURE INCLUDING INJECTION LOGIC CONFIGURATION COMPATIBLE WITH COMPLEMENTARY BIPOLAR TRANSISTORS UTILIZING SIMULTANEOUS FORMATION OF DEVICE REGIONS

This invention relates to silicon semiconductor integrated circuits and particularly to methods of making monolithic silicon integrated circuits containing both linear circuit functions and logic circuit functions. This invention is related to the invention disclosed in Application Ser. No. 658,586 filed Feb. 17, 1976, now abandoned and assigned to the same assignee as this application.

BACKGROUND OF THE INVENTION

A monolithic integrated circuit design involves many compromises. For example, choices are made with respect to substrate doping, epitaxial layer characteristics and diffusion profiles which introduce constraints on circuit design specifics through such parameters as breakdown voltage, parasitic capacitance and series parasitic resistance. In circuits required to perform over a wide dynamic range as is the case for most linear circuits, relatively high breakdown voltage is necessary or otherwise can be advantageous. On the other hand, in integrated logic circuits switching speed is usually the primarily desirable characteristic. In all circuits high packing density, that is, providing maximum circuit function using minimum chip volume, is always sought.

Another similarly universal consideration is that of suitable electrical isolation between circuit elements. The undue inclusion of PN junction isolation, for example, can affect overall circuit integration in a very limiting manner.

Partly, at least, in response to meeting these requirements with minimum conflict, it is the practice generally to partition circuits in device compatible parts and integrate the parts onto separate silicon chips. Thus, a chip usually will comprise solely a linear circuit based on bipolar transistors, a low voltage bipolar logic chip, or a memory chip based on insulated gate field effect unipolar transistors. Circuits combining unipolar and bipolar transistors are rather rarely made, and usually involve a lateral bipolar transistor having less desirable characteristics than a standard vertical transistor. Bipolar logic circuits operate at lower voltage levels and are generally based on technologies optimized for high switching speeds. In linear circuits, while speed is also of concern, a higher voltage capability is more essential.

Although a great many of the needs in micro-electronic apparatus are met by relatively large-scale integration in which each chip is used for only one kind of function, there are applications where it is of great advantage to combine otherwise dissimilar designs on a single chip. In particular, it can be of advantage to be able to combine a small amount of logic function, which might involve several NAND gates, with a linear circuit, such as a comparator or analog switch. Such a combination can be economical not only of semiconductor material but also of interconnecting hybrid elements.

One advantageous structural configuration for the fabrication of linear circuits which provide the flexibility and efficiency of complementary bipolar transistors, is disclosed in the application referred to hereinbefore. The technology disclosed in that application relates to a structure allowing a high degree of isolation as provided by a relatively high resistivity substrate and having the latter combined with a relatively thick epitaxial layer as needed to sustain high operating voltages. This is an arrangement not usually regarded as compatible with the constraints of solid state logic technology.

Integrated injection logic as disclosed for example in U.S. Pat. Nos. 3,643,235, 3,823,353 and 3,922,565 has become available recently as a form of logic which is readily manufacturable and provides good packing density and performance characteristics. One object of this invention is a method of making integrated injection logic gates using the processing techniques of the complementary bipolar transistor technology permitting the combination of integrated injection logic and linear circuits on a single chip.

A further object is an injection logic structure in which both the current source transistor and the switching transistor are of the vertical type and are ideally optimized from the standpoint of injection efficiency and saturation voltage.

SUMMARY OF THE INVENTION

In a typical embodiment the injection logic portion of the integrated circuit shares the high resistivity P-type substrate with the linear circuit portions which contain NPN and PNP transistors. Particular impurity introduction steps of the complementary bipolar technology are used selectively in the injection logic portion of the chip to produce the latter structure. In particular, the step forming the P-type collector of the PNP, and the N-type collector of the NPN, are both used sequentially and selectively to produce buried layers which are partially overlapping and of different depth in the injection logic portion of the chip. The fabrication of the N-type epitaxial layer is common to all portions of the chip and the attendant outdiffusion of the several buried layers thereinto likewise is the same.

The remaining portions of the logic gate structure are fabricated by selective impurity introductions corresponding to certain of those used to form the deep collector connections, the epitaxial conversion zone and base zones of the bipolar transistors.

Thus, a significant feature of the method of this invention is an integrated injection logic structure completely compatible with complementary bipolar integrated circuit technology and in which the injection logic is of an efficient structural form and not merely an expedient compromise.

A further feature is a current source transistor for the injection logic circuit portion which is a high gain unidirectional vertical transistor enabling low power operation. It is also a feature that uniform performance from the multiple collectors of the switching transistors as well as from multiple switching transistors is enhanced by the underlying configuration of the injector zone of the current source transistor which places it equidistant from all switching transistor collectors.

Another feature is the provision of fully isolatable current sources for the injection logic portion so that the substrate may serve normal isolation needs in other portions of the semiconductor chip. A further feature of the injection logic structure is a switching transistor in which the base zone is formed by the epitaxial layer thus providing a uniform impurity distribution across the base enabling advantageous switching performance.

BRIEF DESCRIPTION OF THE DRAWING

The invention and its other objects and features will be more clearly understood from the following detailed description taken in conjunction with the drawing in which:

FIG. 3 is a circuit schematic of the basic injection logic arrangement in accordance with this invention;

FIGS. 4 through 14 are sectional views of three portions of a semiconductor integrated circuit chip containing, respectively, the injection logic gate transistors, an NPN and a PNP transistor and depicting the steps in fabrication.

DETAILED DESCRIPTION

Referring particularly to the chip portions shown in FIGS. 1 and 2 and the circuit schematic of FIG. 3, the injection logic portion of the integrated circuit will be described.

In accordance with this invention the logic gate as shown in FIG. 3 comprises a current source transistor 307 of the NPN type and a switching transistor 306 of the PNP type. The logic signal input is at the base of the switching transistor 306, and, more specifically, binary information is related directly to whether, at node 305, current to the collector of current source transistor 307 takes the path from terminals 301 and 302 or from the base electrode of switching transistor 306. This basic gate configuration may be connected as several stages in cascade to provide the NAND function and direct connection of the collectors of two or more gates may provide a wired NOR function. These logic configurations are known in the art and are not a part of this invention.

Figure 1:
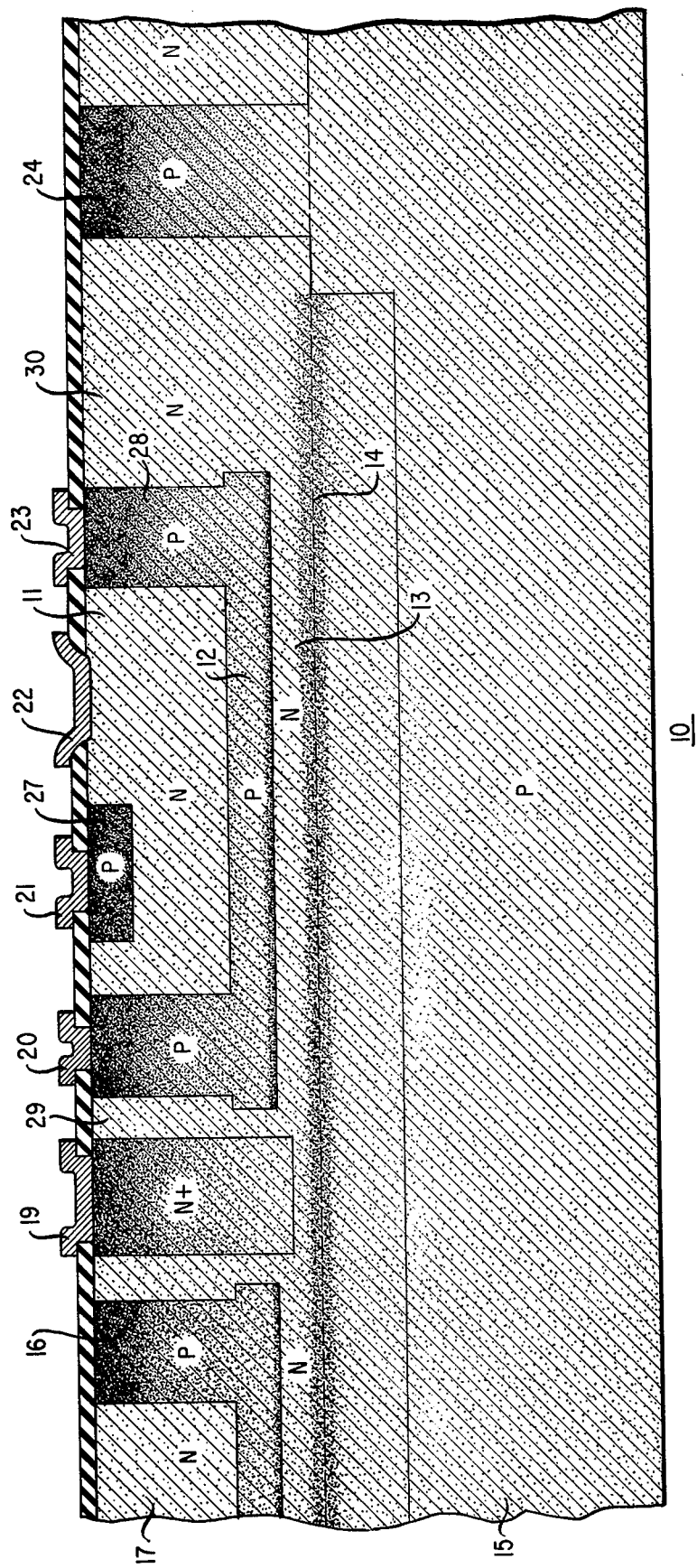
FIG. 1 is a sectional view of a portion of a semiconductor integrated circuit chip containing an injection logic structure in accordance with this invention.

The structure enabling the logic gate of FIG. 3 comprises, as shown in the semiconductor chip portion 10 of FIG. 1, the N-type zone 11 which functions as the base region of the PNP switching transistor 306 and the collector region of the NPN current source transistor 307. P-type conductivity zone 12 likewise has a dual function as the emitter region of the PNP transistor 306 and as the base region of the NPN transistor 307.

The NPN current source transistor 307 has an N-type emitter region 13 which reaches the surface of the chip by way of the regions 29 and 30. The ohmic metallic contact 19 to region 29 comprises the emitter electrode and corresponds to the terminal 311 of FIG. 3. Identical reference numerals are used insofar as possible in FIG. 1 and FIG. 2 to indicate the same elements.

The PNP switching transistor 306 may have multiple collectors constituting the gate outputs 303 and 304. In one arrangement in accordance with the invention the collectors are formed by impurity doped regions 27 and 31 as shown in FIGS. 1 and 2. Ohmic connections 21 and 33 to these zones constitute the electrodes thereof corresponding to the terminals 303–304 of FIG. 3. In connection with the description of the fabrication of this structure alternative arrangements for the switching transistor collectors will be described. The input connections to the gate corresponding to terminals 301 and 302 and diodes 309 and 310 of FIG. 3, is by way of the electrodes 22 and 32 of FIGS. 1 and 2 which are of the Schottky barrier rectifying type. This type contact, as is known in the art, provides for advantageous operation of the logic gate. The ground contact, terminal 308 in FIG. 3, corresponds to contact regions 20 and 23 of FIGS. 1 and 2.

The semiconductor chip is fabricated on a P-type conductivity substrate 15 upon which there is deposited an N-type epitaxial layer, and the initial interface of these two parts is indicated by the broken line 14. The particular logic gate composed of the transistors 306 and 307 may be one of an array of several similar gate arrangements between which no isolation is necessary. In particular, another logic gate may adjoin the structure just described which will be comprised of P-type region 16 and N-type region 17 corresponding to P-type region 28 and N-type region 11 described above, or may adjoin vertically, as shown in FIG. 2, where regions 26 and 28 are shared by adjoining gate regions 34 and 35. Adjoining gates also may share a common current source transistor by way of the contact 19 and region 29.

The entire logic portion of the chip can be isolated from the linear circuit portion of the chip by the P-type isolation zone 24 which connects to the P-type substrate 15. The particular steps for forming the logic portion of the chip at the same time as the linear circuit portions are fabricated will be described with reference to the FIGS. 4 through 14.

The fabrication of the NPN and PNP complementary bipolar transistors in the linear circuit portion of the chip follows the fabrication procedure set forth in the application of Beadle-Moyer-Yiannoulos referred to above. In particular, and with reference to FIG. 4, the silicon semiconductor chip portions 40, 41 and 42 represent parts of a monolithic silicon semiconductor chip which, for fabrication purposes, is part of a relatively large silicon wafer from which many chips are simultaneously fabricated. Typically, the substrate wafer from which the devices in accordance with this invention are fabricated is P-type having a resistivity of from about 4 to 15 ohm centimeters, and is monocrystalline silicon.

In the fabrication procedures described herein it will be understood that any of the various techniques known in the art for selectve introduction of significant impurities into a semiconductor body may be used. These include various photolithographic techniques as well as more recently developed electron beam methods for defining masking patterns. Likewise, both the techniques of solid state diffusion and ion implantation, alone or in combination, may be suitable for the actual impurity introduction step.

The succession of fabrication steps used to make the NPN transistor in chip portion 41 and the complementary PNP transistor in portion 42 are similar to those disclosed in the above-noted application of Beadle-Moyer-Yiannoulos. In particular, as shown in FIG. 5, the N-type isolation zone 51 of the buried type is formed first in chip portion 42. This step may be a phosphorous impurity introduction using ion implantation.

Figure 6:
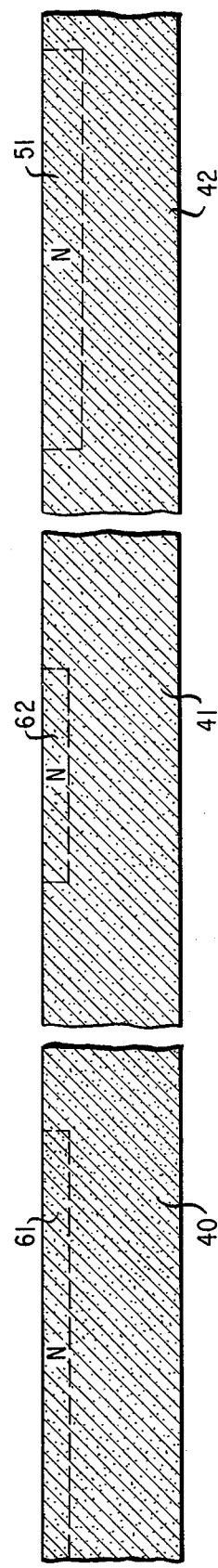
Figure 7:
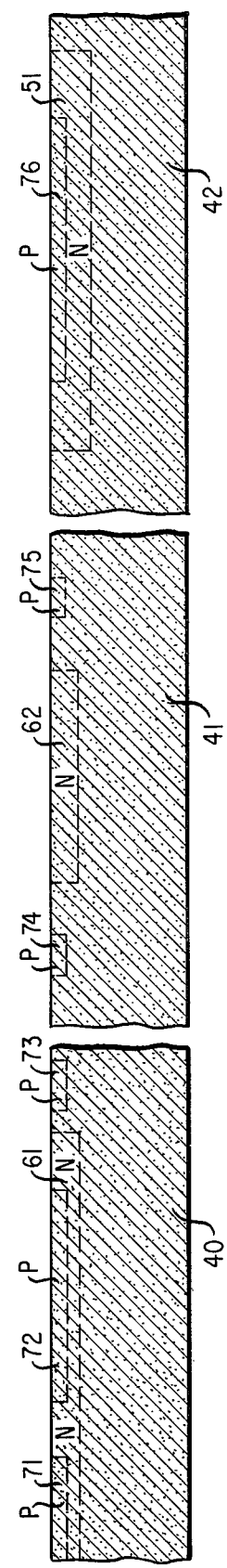

Next as shown in FIG. 6, there is an N-type impurity introduction using arsenic to form buried zones 61 in chip portion 40 and 62 in chip 41. Following this step there is a P-type impurity introduction selectively to form buried zones 71, 72 and 73 in chip portion 40, buried zone 74 and 75 in chip portion 41 and buried zone 76 in chip portion 42, all as shown in FIG. 7. This step involves the ion implantation of boron. In a specific embodiment the phosphorus introduction step of FIG. 5, by ion implantation, is at a dosage of $3 \times 10^{13}$ per square centimeter at 50 KEV. This ion implantation is followed by a heat treatment at 1270° C for 5½ hours in an atmosphere of oxygen or an oxygen-nitrogen mixture. The arsenic introduction step of FIG. 6 is at a dosage of $3 \times 10^{15}$ using the same energy level as the phosphorus implantation. The arsenic implantation is followed by a similar heat treatment. The ion implantation of boron (FIG. 7) is at a dosage of $1.5 \times 10^{15}$ per square centimeter at50 KEV and is followed by a heat treatment at 1200° C for 45 minutes in pure oxygen, or a mixture of oxygen and nitrogen.

Figure 8:
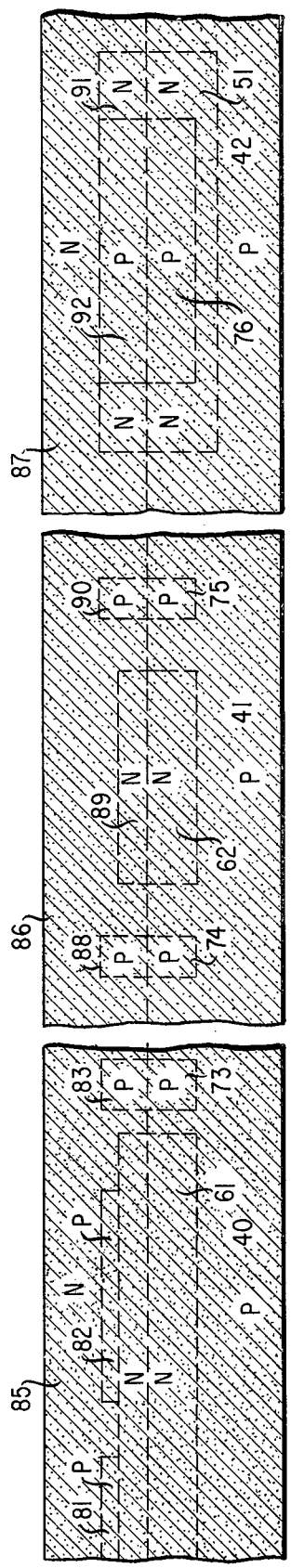
Figure 15:
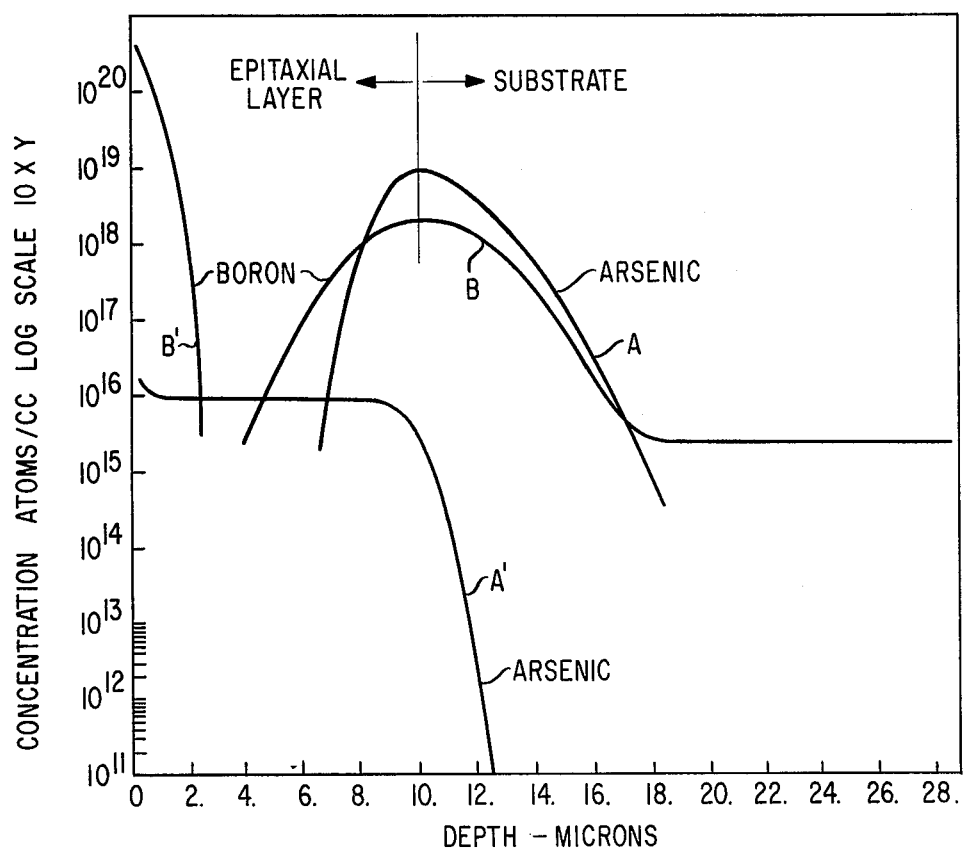
FIG. 15 is a graph illustrating the impurity concentration profile in the logic circuit portion of the device in accordance with the invention.

Next as shown in FIG. 8, an N-type conductivity epitaxial layer 85-86-87 is formed by a deposition of silicon over the entire semiconductor wafer. This layer is an N-type conductivity film having a resistivity of about 0.7 to 1.2 ohm centimeters and a thickness between about 8 and 11 microns. During the deposition of the epitaxial layer 85-86-87, the impurities implanted in the substrate outdiffuse into the deposited layer to an extent determined by the diffusion constants and the temperature and duration of the process. The configurations formed in chip portions 41 and 42 form the buried collector and isolation zones for the NPN and PNP complementary transistors. The effect of this outdiffusion in chip portion 40 during the epitaxial deposition step is graphically illustrated in FIG. 15 which shows the absolute impurity concentrations through that portion of the chip upon completion of the fabrication process. As shown, the epitaxial layer has a thickness of 10 microns and the boron and arsenic doped buried layers have concentration peaks at the epitaxial to substrate interface. Curve A depicts the arsenic doping attributable to the inclusion of that impurity in the substrate and as added to produce a buried layer. Curve A' indicates the arsenic concentration attributable to its inclusion in the deposited epitaxial layer.

Curve B depicts the boron concentration attributable to the boron put into the substrate to form a buried layer and curve B' is boron put into the surface of the epitaxial layer. Inasmuch as boron has a higher diffusion constant than arsenic, the boron moves more rapidly than the arsenic during epitaxial deposition and subsequent heat treatment, and thus spreads to a greater extent. Consequently, this reduces the boron concentration level near the epitaxial-substrate interface and thus arsenic remains the predominant dopant in that portion. Accordingly, P-type zone 82 represents the extent of boron diffusion beyond the arsenic diffusion, and is of particular significance with respect to the device structure of the logic gate portion 40.

The next step is a selective predeposit and diffusion of phosphorus to form the N-type conductivity zones 93, 94, 95, 96 and 97 of FIG. 9. In chip portion 41 the N-type zone 95 is a deep collector connection, and in chip portion 42 zones 96 and 97 are isolation connection zones. In the logic chip portion 40 N-type zones 93 and 94 are similar to deep collector connections and may also serve to define and isolate a portion of the injection logic gate structure. In particular, N-type zones 93 and 94 enable a top surface connection to the emitter zone of the current source transistor.

Next, as shown in FIG. 10, a P-type impurity such as boron or aluminum is selectively introduced by ion implantation to complete, by means of P-type zones 105 and 106, the isolation in chip portion 41. In chip portion 42, the P-type zone 107 constitutes a reconversion of a portion of the epitaxial layer 87 to P-type conductivity. In the logic chip portion 40 this selective P-type impurity forms zones 101, 102, 103 and 104. Zone 104 completes the chip isolation while the other zones enable connection to the P-type buried zone 82 produced by the outdiffusion of boron. The arrangement shown in FIG. 10 may be achieved following the ion implantation of boron or aluminum at a dosage of about $2 \times 10^{13}$ which then is followed by a heat treatment at 1200° C for about 120 minutes in pure oxygen. This heat treatment drives in both the ion implanted boron or aluminum and the predeposited phosphorus of the previous step.

At this point, the basic structure of the logic chip portion 40 has been produced. There remains primarily the step of fabricating the collector output for the PNP switching transistor. Depending on the impurity concentration in the surface portion of N-type region 112, several alternatives are available. As shown in FIG. 1, a P-type conductivity zone 27 may be formed to which ohmic connection then may be made.

Figure 12:
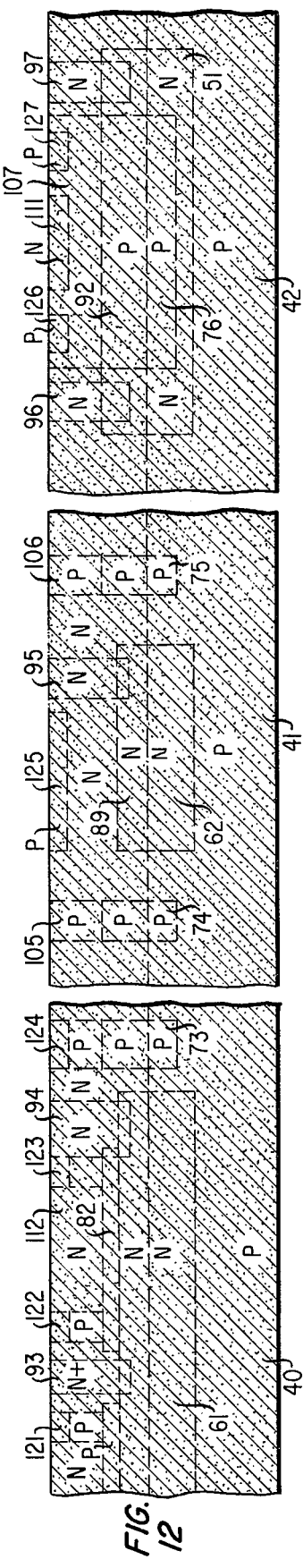

The P-type zone 27 may be formed at the same time that the P-type emitter zone is formed in the PNP transistor. Prior to that step, however, and as shown in FIGS. 11 and 12, the N-type base zone 111 is formed in chip portion 42 and the P-type base zone 125 is formed in chip portion 41. The N-type base zone 111 may be formed by a selective ion implantation of phosphorus at a dosage of about $3 \times 10^{14}$ followed by a 30 minute heat treatment in oxygen at 1200° C. The P-type base zone 125 is formed by a selective gaseous predeposition of boron at 870° C for 85 minutes using boron nitride discs as a source, followed by a heat treatment at 1150° C for about 30 minutes in oxygen. During this step there are also formed P-type contact enhancement zones 121, 122, 123 and 124 in chip portion 40, and zones 126 and 127 in chip portion 42.

Figure 13:
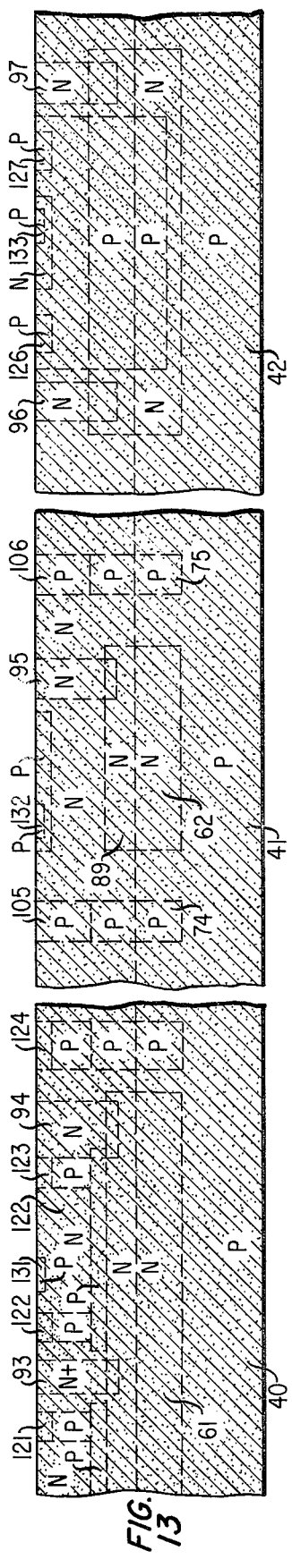
Figure 14:
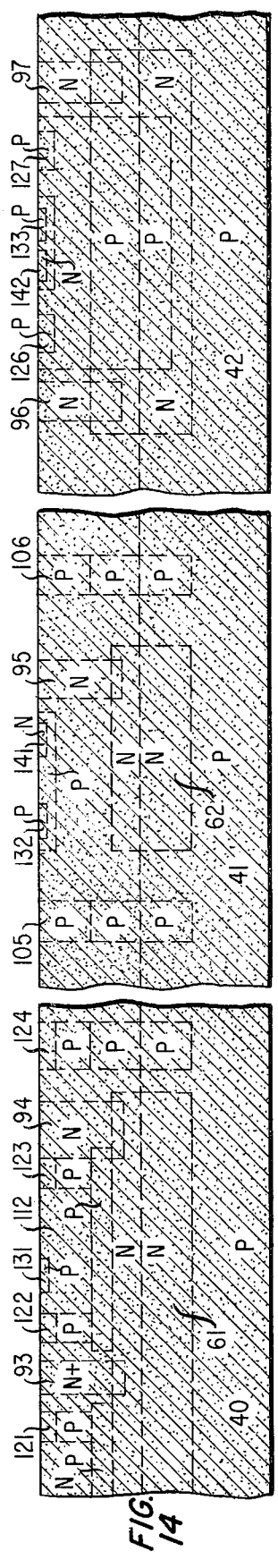

Then, referring to FIG. 13, a selective boron diffusion at 1100° C for 36 minutes produces the base contact enhancement zone 132 of the NPN transistor, the P-type emitter zone 133 of the PNP transistor and the P-type zone 131 in chip portion 40. FIG. 14 shows the final impurity introduction for the bipolar complementary transistors, namely, formation of the N-type emitter zone 141 in chip portion 41 and base contact enhancement zone 142 in chip portion 42.

In another alternative, the P-type zone 131 may be formed by an impurity introduction using ion implantation following the foregoing described steps and in conjunction with the initial masking operation for metallizing the device structure. This masking step may be used also to alter the conductivity in the area of the collector output connection enabling the formation of a rectifying Schottky barrier contact as will be referred to hereinafter.

The configuration of conductivity type zones shown in FIG. 14 represents a final form of these chip portions from the standpoint of impurity introduction excepting only selective ion implantations for the purpose of altering conductivity in a particular area to permit the fabrication of a particular kind, ohmic or rectifying, of external contact thereto. Thus the device structures shown in FIG. 14 are completed by the application of suitable metallization patterns constituting the device interconnections as well as means for external connection. A particular technique suitable for use with the foregoing described processes and providing a bram lead type of structure is disclosed in U.S. Pat. No. 3,808,108 granted Apr. 30, 1974 to G. K. Herb and E. F. Labuda.

Figure 2:
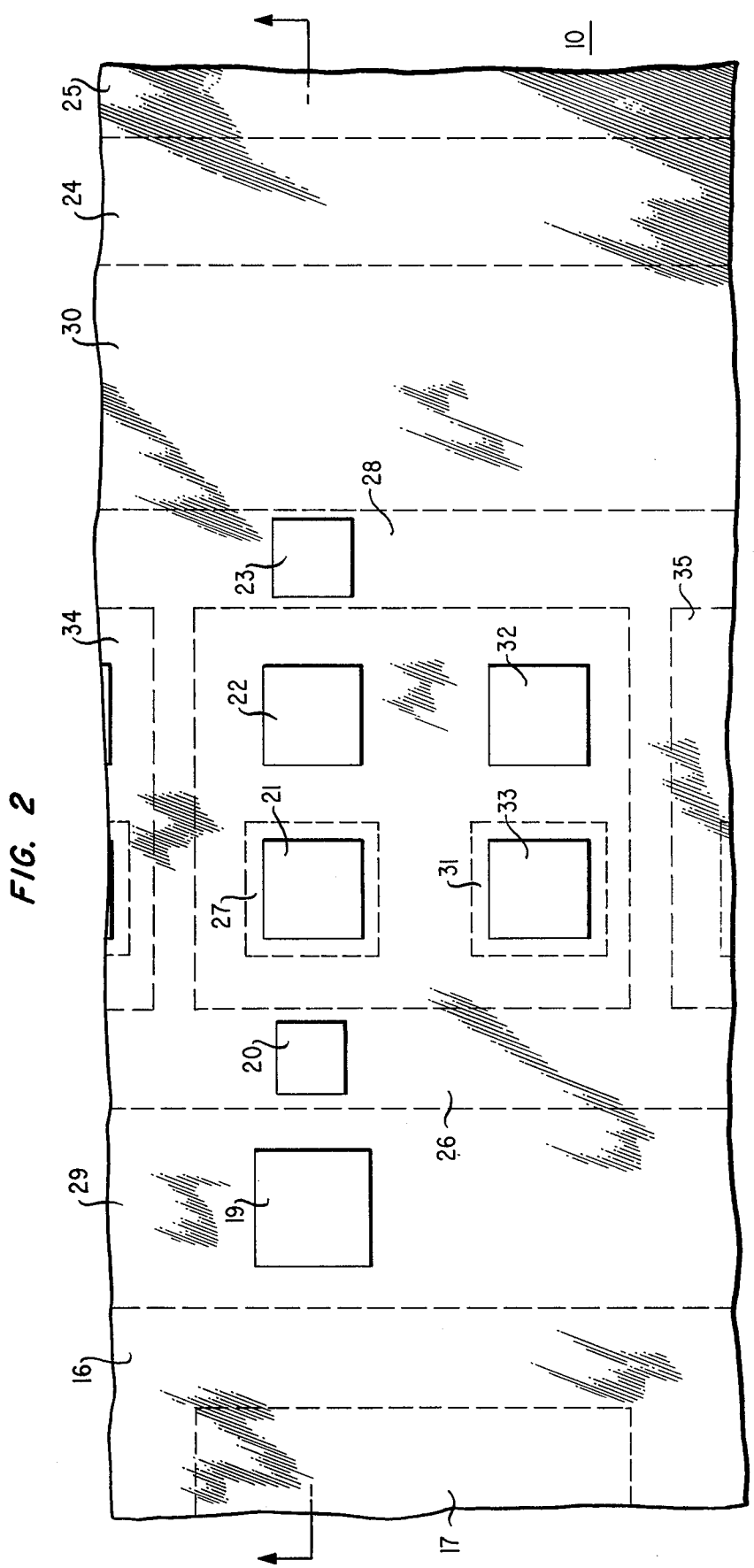
FIG. 2 is a plan view of the chip portion shown in FIG. 1.

Referring to FIGS. 1 and 2 there is shown the chip portion 40 of FIG. 14 with metal contacts applied thereto. As previously noted, the metallic contacts 22 and 32 are of the Schottky rectifying barrier type utilizing, for example, the platinum silicide contact well known in the art. These contacts may be formed at the same time as the ohmic contacts are formed to the other portions of the circuit. Inasmuch as zone 11 is of relatively low conductivity, the metal contact thereto will be a rectifying barrier, while those to the other device zones will be ohmic. Accordingly, if Schottky diodes are not desired in the input leads from terminals 301 and 302 (FIG. 3) the diffusion step for making the N-type emitter zone 141 (FIG. 14) may be used to form shallow N-type enhancement zones to enable the formation of ohmic contacts 22 and 32.

Likewise, the collectors of the PNP switching transistor 306 (FIG. 3) may be Schottky barrier rectifying contacts, omitting the P-type zone 27 (FIG. 1) and substituting a metallic barrier rectifying contact in place of ohmic contact 21. These arrangements are already generally known in the art but are more facilely accomplished in this particular structure because the N-type zone 111 is comprised of the N-type epitaxial layer which is of appropriately high resistivity as compared to the relatively low resistivity of the diffused region usually found in injection logic circuit devices. In this connection it will be appreciated that, as shown in FIG. 2, Schottky type output collector contacts 21 and 33 and input contacts 22 and 32 can be formed in multiple arrays as required by circuit needs.

In contrast with the conventional injection logic structure, the configuration shown in FIG. 1 includes a current source transistor or injector which is of the vertical type and has a relatively high alpha in the upward direction, that is, toward the epitaxial layer by virtue of the relative impurity concentrations, the thin P-type base zone 12, and the favorable grading of the boron impurity in this zone. Conversely, the alpha in the downward direction is desirably low. With this configuration no particular design constraint is placed on the epitaxial layer which then can be adjusted for thickness and resistivity to allow fabrication of linear devices having higher breakdown voltage requirements. The presence of the relatively high resistivity P-type substrate allows for device and circuit isolation both within the logic portion and between logic and linear portions.

Thus, in accordance with this invention there is fabricated a monolithic integrated circuit combining a highly advantageous injection logic configuration with the known complementary bipolar integrated circuit (CBIC) technology. The structure thus produced contains only a single epitaxial layer in which all transistors are of the vertical type and all contacts are conveniently on the upper surface of the device.

What is claimed is:

1. The method of fabricating an integrated circuit in a monolithic semiconductor body, said circuit including a logic gate of the injection logic type in a first portion of said body and complementary bipolar transistors of the NPN and PNP type in second and third portions of said body respectively, said monolithic body comprising a monocrystalline silicon substrate and no more than one epitaxially deposited layer of silicon over said substrate, said complementary transistors being fabricated by the following steps:

(1) introducing a first N-type dopant into a first limited surface area of the third portion substrate to form the PNP collector isolation zone, (2) introducing a second N-type dopant into a limited surface area of the second portion substrate to form the NPN buried collector zone, (3) introducing a P-type dopant into a part of said first limited surface area of step (1), and completely within said first limited surface area of the third portion substrate to form the PNP buried collector zone, (4) forming on the second and third portion substrate an epitaxial layer of N-type silicon, (5) selectively introducing an N-type dopant into surface areas of the epitaxial layer on said second and third portions to form deep collector connection zones, and an annular isolation zone, respectively, (6) selectively introducing a P-type dopant into the surface area of said epitaxial layer of said third portion, coincident with said part of Step (3) to reconvert the epitaxial layer portion of the PNP adjoining the buried collector from N-type to P-type, (7) selectively introducing an N-type dopant into a surface area of the epitaxial layer on said third portion to form the base zone of said PNP transistor, (8) selectively introducing a P-type dopant into a surface area of the epitaxial layer on said second portion to form the base zone of said NPN transistor, (9) selectively introducing a P-type dopant into a portion of the base zone of said PNP transistor to form an emitter zone,

(10) selectively introducing an N-type dopant into a portion of the base zone of the NPN transistor to form an emitter zone, the method characterized in that the logic gate is formed in the first portion simultaneously by the following sequence of steps performed simultaneously with specific steps performed on the second and third portions, (a) introducing an N-type dopant in accordance with Step (2) for forming an N-type buried layer in said first portion, (b) selectively introducing a P-type dopant in accordance with Step (3) for forming a P-type buried layer within said N-type buried layer formed in step (a), (c) forming on said first portion in accordance with Step (4) an N-type epitaxial layer, (d) selectively introducing an N-type dopant into surface areas of the epitaxial layer on said first portion in accordance with Step (5), (e) selectively introducing a P-type dopant into an annular surface area of the epitaxial layer on said first portion in accordance with Step (6) to isolate a portion of said epitaxial layer above the P-type buried layer formed in step (b), and (f) then, in a step not necessarily performed simultaneously with specific steps performed on the second and third portions of the chip, forming a rectifying connection to a limited region of the N-type epitaxial layer on said first portion, said region being spaced away from the P-type doped areas formed in Step (e).

2. The method in accordance with claim 1 in which the rectifying connection of Step (f) is formed by introducing a P-type dopant in accordance with Step (9) and simultaneously therewith.

3. The method in accordance with claim 1 in which the rectifying connection of Step (f) is formed subsequent to Step (10) by depositing a metal film thereby to form a Schottky barrier rectifying contact.

4. The method in accordance with claim 1 in which the rectifying connection of Step (f) is formed subsequent to Step (10) by introducing a P-type dopant.

5. The method in accordance with claim 1 in which said first N-type dopant is phosphorus.

6. The method in accordance with claim 1 in which said second N-type dopant is arsenic.

7. The method in accordance with claim 1 in which said P-type dopant is boron.

8. The method in accordance with claim 1 in which the N-type dopant of Step (d) is introduced into spaced-apart areas and penetrates through the epitaxial layer to intersect the N-type buried layer.

9. The method in accordance with claim 8 in which the P-type dopant of Step (e) is introduced into areas adjoining the N-type doped areas of Step (e) and penetrates through the epitaxial layer to intersect the P-type buried layer.

* * * * *